(12) United States Patent
Kasten

(10) Patent No.: US 7,157,999 B2
(45) Date of Patent: Jan. 2, 2007

(54) LOW DRIFT SUPERCONDUCTING HIGH FIELD MAGNET SYSTEM

(75) Inventor: Arne Kasten, Karlsruhe (DE)

(73) Assignee: Bruker Biospin GmbH, Rheinstetten (DE)

( * ) Notice: Subject to any disclaimer, the term of this patent is extended or adjusted under 35 U.S.C. 154(b) by 0 days.

(21) Appl. No.: 11/055,693

(22) Filed: Feb. 11, 2005

(65) Prior Publication Data

US 2006/0066429 A1  Mar. 30, 2006

(30) Foreign Application Priority Data

Feb. 16, 2004  (DE) ............... 10 2004 007 340

(51) Int. Cl.
  *H01F 6/00*  (2006.01)
  *G01V 3/00*  (2006.01)
(52) U.S. Cl. ............... 335/216; 324/318; 324/319
(58) Field of Classification Search ............... 335/216, 335/296–301; 324/318–320
  See application file for complete search history.

(56) References Cited

U.S. PATENT DOCUMENTS

| 4,788,502 A | 11/1988 | Keller et al. |
| 4,974,113 A | 11/1990 | Gabrielse |
| 5,138,383 A * | 8/1992 | Shiga et al. ............... 335/216 |
| 5,278,503 A | 1/1994 | Keller |
| 5,596,303 A | 1/1997 | Akgun |
| 6,020,803 A * | 2/2000 | Wheatley et al. ............ 335/216 |
| 6,753,748 B1 * | 6/2004 | Schlenga ............... 335/216 |

FOREIGN PATENT DOCUMENTS

| DE | 101 56 234 | 2/2003 |
| EP | 0 459 156 | 12/1991 |

OTHER PUBLICATIONS

T. Hase et al., Development of Bi-2212 Multifilamentary Wire for NMR Usage, Physica C, 335, (2000), pp. 6-10.
K. Fukushima, Fabrication and Transport Properties of Bi-2212/Ag Prototype Magnets for 1 GHz-NMR Magnet System, Physica C, 357-360, (2001), pp. 1297-1301.

\* cited by examiner

*Primary Examiner*—Ramon M. Barrera
(74) *Attorney, Agent, or Firm*—Paul Vincent

(57) ABSTRACT

The invention concerns a superconducting high-field magnet system (1) for a high-resolution magnetic resonance spectrometer, comprising a magnet coil (4) which is superconductingly short-circuited during operation, and generates a homogeneous temporally stable magnetic field during operation that meets the requirements for taking a high-resolution magnetic resonance spectrum. The magnet coil (4) comprises an LTS partial coil (4b, 4c) and an HTS partial coil (4a, 4d). The LTS partial coil (4b, 4c) can be separately short-circuited in a pure LTS circuit (14b) via an LTS switch (15b), and the HTS partial coil (4a, 4d) can be separately short-circuited in a pure HTS circuit (14) via an HTS switch (15a) and both partial coils (4a, 4d; 4b, 4c) are connected via an LTS-HTS joint (20) and are charged by the same power supply.

17 Claims, 3 Drawing Sheets

LOW DRIFT SUPERCONDUCTING HIGH FIELD MAGNET SYSTEM

This application claims Paris Convention Priority of DE 10 2004 007 340.6 filed Feb. 16, 2004 the entire disclosure of which is hereby incorporated by reference.

BACKGROUND OF THE INVENTION

The invention concerns a superconducting high-field magnet system for a high-resolution magnetic resonance spectrometer, comprising a substantially cylindrical cryostat with an axial room temperature bore for receiving a sample, and a radio-frequency transmitting and detecting system, with a magnet coil which is superconductingly short-circuited during operation and which is disposed at a low temperature in a region within the cryostat to surround the sample in the room temperature bore and to generate a homogeneous, temporally stable magnetic field at the sample location during operation, wherein the magnetic field meets the requirements for obtaining a high-resolution magnetic resonance spectrum.

High-resolution nuclear magnetic resonance (NMR) spectrometers must have magnetic fields with good temporal stability in addition to an extremely high homogeneity over the sample volume. Towards this end, the superconducting main coil of the magnet is superconductingly short-circuited during operation. The properties of the superconducting short-circuit switch, the quality of the superconducting coil wires and superconducting joints between individual wire sections of the coil must therefore meet highly stringent requirements. During short-circuit operation, decay times of the superconducting coil current of several 10,000 years must be guaranteed.

Temporal fluctuations of the magnetic field at the sample location may be compensated for using a so-called lock system. Towards this end, the spectrometer measures a separate NMR signal of a lock substance (i.a. deuterium) in a frequency band provided for this purpose, and its frequency is stabilized via a feedback circuit using a small resistive compensation coil (lock coil) in the room temperature bore of the magnet system.

A superconductingly short-circuited magnet coil keeps the magnetic flux through its bore constant, i.e. the superconducting current changes spontaneously in response to e.g. an external disturbance field, such that the total flux through the coil does not change. This does not generally mean that the field in the working volume remains absolutely homogeneous and constant, since the local field distribution of a disturbance and of the main magnet coil do not coincide. Prior art has proposed compensation of these deviations through the design of the main coil geometry, additional superconducting coils or through active control measures (U.S. Pat. No. 4,974,113; U.S. Pat. No. 4,788,502; U.S. Pat. No. 5,278,503).

High-resolution superconducting NMR magnets generally use superconducting shim coil sets to initially homogenize the field at the sample location. During operation, the individual coil sets are charged with a correction current and are superconductingly short-circuited. The shim coil sets may also comprise a so-called $B_0$ coil which can generate a sufficiently homogeneous, small additional field at the sample location. It is thereby possible to finely and precisely adjust the field or the proton frequency to a predetermined value without opening the superconducting circuit of the main coil. Moreover, it has been known for some time that, within certain limits, a main coil drift can also be compensated for using the short-circuited $B_0$ coil. Towards this end, the $B_0$ coil must be disposed and dimensioned such that the field decay of the main coil induces a counter current in the $B_0$ coil which causes the field at the sample location to remain constant. This method is limited in that the current through the $B_0$ coil must not become excessively large. The maximum current may be limited by the wire which is used. In any event, the contribution of the (low homogeneity) $B_0$ coil must remain sufficiently small such that the field homogeneity throughout the sample is not impaired. Moreover, in case of a quench, the $B_0$ coil could be overloaded and destroyed in consequence of the required inductive coupling between the $B_0$ coil and the main coil. Corresponding protective means must be introduced, which result in additional expense.

The production of superconducting high field magnets for high-resolution NMR spectrometers (and also ion cyclotron resonance (ICR) spectrometers) has reached a very high level of quality and reliability. The currently used wire materials are multi-filament wires of NbTi or Nb3Sn filaments in a copper matrix (with common, conventional modifications). Corresponding wires can be obtained e.g. from the company European Advanced Superconductors GmbH & Co KG, Hanau. The problems involved with the production of superconducting joints and switches between coils or coil sections made from these wires are also solved in the above-mentioned NMR spectrometers (see e.g. EP 0 459 156 B1).

For the highest desired magnetic fields—currently in the region of around 23 Tesla—one has started to replace conventional low temperature superconducting (LTS) wires in the highest field section with wires (bands) of ceramic, high-temperature superconductors (HTS) which permit (at a low temperature of approximately 4 K or 2 K) higher critical field strengths and current densities. The initial problem of producing wires from these materials which meet the high NMR requirements also seems to be solved. However, the problem with the superconducting joints and switches between and to these wires remains unsolved. There are different approaches which do, however, not form part of the present invention. It is still unclear which approaches will ultimately be successful. However, it is, in principle, much easier to produce drift-less joints between wires of the same material or the same material class than between different materials, in particular, between HTS and LTS conductors.

Accordingly, a highest-field NMR magnet coil will therefore consist of a series of sections with NbTi wire, sections with Nb3Sn wire (or further developments thereof) and at least one section with HTS wire (or band). For this reason, the use of joints is desired which join NbTi wire and NbTi wire without drifts (solved), those between NbTi wire and Nb3Sn wire (solved), those between Nb3Sn wire (and/or NbTi wire) and the HTS conductor (currently not solved) and optionally between identical and/or different HTS conductors (currently solved on a laboratory scale and considerably easier). I.a. bismuth conductors, generally in the form of a band-shaped multi-filament wire in a silver matrix, YBCO as "coated conductor" or conductors produced in accordance with the "powder-in-tube-method" are currently being examined as HTS conductors. Further variants are feasible which exist at the moment only on a laboratory scale.

The recently discovered conductor MgB2 could be used in the LTS and also in the HTS circuit, assuming that it is compatible with the corresponding joints.

Due to the fact that the problems with joints are only partially solved, there are currently no magnets for high-resolution NMR with HTS partial coils.

For this reason, there is a need for a superconducting magnet system of the above-mentioned type which produces higher magnetic fields at the sample location thereby still meeting the NMR criteria with, in particular, the prevention or at least minimization of drifts.

SUMMARY OF THE INVENTION

This object is achieved in accordance with the invention in that the magnet coil consists of a low-temperature superconducting (LTS) partial coil and a high-temperature superconducting (HTS) partial coil, wherein the LTS partial coil can be separately short-circuited in a pure LTS circuit via an LTS switch and the HTS partial coil can be separately short-circuited in a pure HTS circuit via a HTS switch, wherein both partial coils are connected via a LTS-HTS joint and can be charged in series by the same power supply.

As mentioned above, the production of joints between similar conductors is much easier. HTS-HTS joints with low drifts can be realized and it can be assumed that nearly drift-less HTS-HTS joints will be available shortly, in addition to LTS-LTS joints. The object is therefore completely solved since, during operation, the superconducting currents can flow in (almost) drift-free circuits thereby avoiding the problems of critical LTS-HTS joints. LTS-LTS joints and HTS-HTS joints have, in any event, substantially less drift than LTS-HTS joints.

The LTS circuit is preferably inductively decoupled from the HTS circuit, such that uncontrolled charging of one of the circuits is not possible in case of a quench in the other circuit.

For inductive coupling, the HTS circuit preferably also comprises coil regions which are locally separated from the actual HTS partial coil. The counter inductance zero can thereby be more precisely set.

Alternatively, the two partial coils are inductively coupled such that possible drifts of the two superconductingly short-circuited partial circuits are largely compensated for in the magnetic field at the sample location. Compensation of the drift of one of the two partial circuits may thereby be effected through inductive charging of the other. It must thereby be noted that the drifts of NMR magnets are extremely low in absolute magnitude, i.e. there is no danger that the further charged partial circuit exceeds admissible limits, even over long periods of time.

It is again useful for simple and precise adjustment of the inductive coupling to an overall field drift of zero at the sample location, if the HTS circuit also comprises coil regions which are locally separated from the actual HTS partial coil.

To keep the overall system as variable as possible, the overall magnet coil can preferably be short-circuited via an LTS and/or HTS switch.

The magnet coil or partial coils or sections thereof may comprise leads or connections which comprise parallel HTS and LTS conductors. This could be required to produce pure HTS or LTS circuits, but may also offer further advantages for effecting alternatively designed joints and/or switches and for transition to higher temperatures.

The overall magnet coil is preferably actively shielded thereby minimizing the stray field and also permitting the effects of mechanical stress on the coil system to be more easily handled.

If the LTS and also the HTS partial coils are each designed as an actively shielded coil system, none of the partial circuits has a stray field, and prevention of a stray field, e.g. in case of disturbances, is facilitated for all operational conditions.

Ferromagnetic components may also be included in the overall concept of the coil, in particular, in the direct region of the magnet coil i.e. at a low temperature. These may considerably contribute to stray field reduction and/or homogenization of the magnetic field in the volume under investigation.

Due to the fact that both partial circuits are separately short-circuited, they can, in principle, be charged with different currents, e.g. by closing one partial circuit during charging and continuing charging of the other. This provides a further degree of freedom in the design of the conductor materials and shapes. If the partial circuits are inductively decoupled, the currents which are present at the respective short-circuiting time continue to flow. If not, the fact that the circuit which has been closed first, discharges via the counter inductance when the open circuit is charged must be taken into consideration.

The magnetic coil advantageously comprises several serially connected sections which are protected by a network of protective resistances and/or diodes in case of uncontrolled transition into the normally conducting state.

The LTS partial coil may preferably contain sections with NbTi multi-filament wire and/or with A15 superconducting wire, in particular, Nb3Sn multi-filament wire and/or MgB2 wire.

The HTS partial coil may contain a conductive band with silver matrix and HTS filaments and/or also a conductor which is designed in accordance with the "coated-conductor" principle or a band conductor which is produced in accordance with the "powder-in-tube" method. These are common HTS conductors whose series production will soon start, even for demanding NMR magnet design.

The materials which can be used are i.a. Bi2212 and/or Bi2232 and/or YBCO and/or MgB2.

The inventive measures are useful, in particular, in the high-field region, where the common conductors and switches meet their limits. For this reason, the magnet coil advantageously generates a magnetic field at the sample location during operation of more than 15 Tesla, in particular more than 20 Tesla.

Although the inventive magnet system utilizes high-temperature superconductors, it may still be advantageous in many cases to operate them at temperatures which are considerably less than their transition temperature. Towards this end, the overall magnet coil is preferably disposed in a helium tank at approximately 4 K or also at approximately 2 K, which provides higher critical values, in particular for the LTS circuit.

The present invention is preferably also utilized in combination with further conventional measures which provide common resistive and/or superconducting compensation arrangements to minimize the influence of external disturbances or drifts at the sample location, wherein interaction between the various shielding and compensation measures must always be taken into account. This must either be partially suppressed (zero coupling) or the overall behavior of the apparatus must be explicitly considered in the design.

Further advantages of the invention can be extracted from the description and the drawing. The features mentioned above and below may be used in accordance with the invention either individually or in arbitrary combination.

The embodiments shown and described are not to be taken as exhaustive enumeration but have exemplary character for describing the invention.

DESCRIPTION OF THE PREFERRED EMBODIMENT

Figure 1:
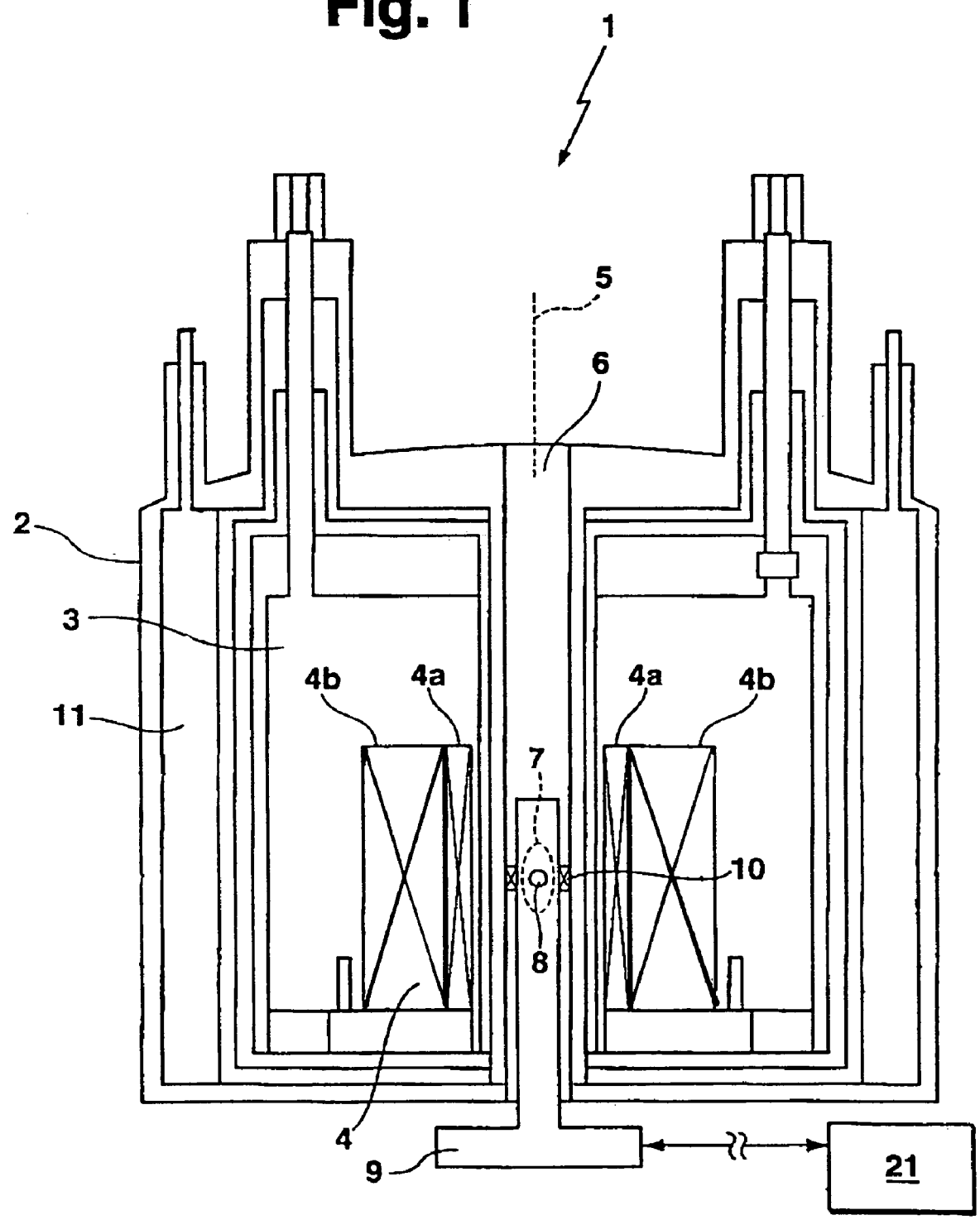
FIG. 1 shows an extremely schematic view of the cryostat of a nuclear magnetic resonance apparatus with a first LTS partial coil and a second HTS partial coil in the helium tank.

FIG. 1 schematically shows, in detail, a section through the substantially rotationally symmetrical cryostat of the superconducting magnet system 1, e.g. of a high-resolution NMR apparatus. The magnet coil 4 which is superconductingly short-circuited during operation and consists of two partial regions, i.e. of two partial coils 4a (first partial coil—HTS) and 4b (second partial coil—LTS) is disposed in a helium tank 3 of the cryostat 2. The cryostat 2 has a room temperature bore 6 along its cylinder axis 5 within which, in a measuring region 7 at the center of the magnet coil 4, a sample 8 is disposed which is surrounded by a radio-frequency (RF) transmitter and receiver coil arrangement 9 (probe head).

A so-called lock coil 10 is also located inside the room temperature bore 6, optionally integrated in the probe head 9, for fine correction of the magnetic field in the measuring region. This lock coil 10 is not or only slightly coupled to the magnet coil 4. The correction current through the lock coil 10 in an NMR spectrometer is generally controlled via the NMR console 21 by an NMR lock signal of a lock substance which is added to the sample 8, such that the NMR frequency of the lock substance (e.g. deuterium) and thereby the magnetic field at the sample location remain constant. Such lock arrangements are known in the art and are very precise. However, they have a small range and are designed to correct fluctuations about the desired value. They are not suitable for correcting continuous field drifts.

The helium tank 3 of the cryostat 2 is surrounded by a nitrogen tank 11 in the present example, which may optionally also be replaced by refrigerators, in particular, pulse tube coolers.

Figure 2:
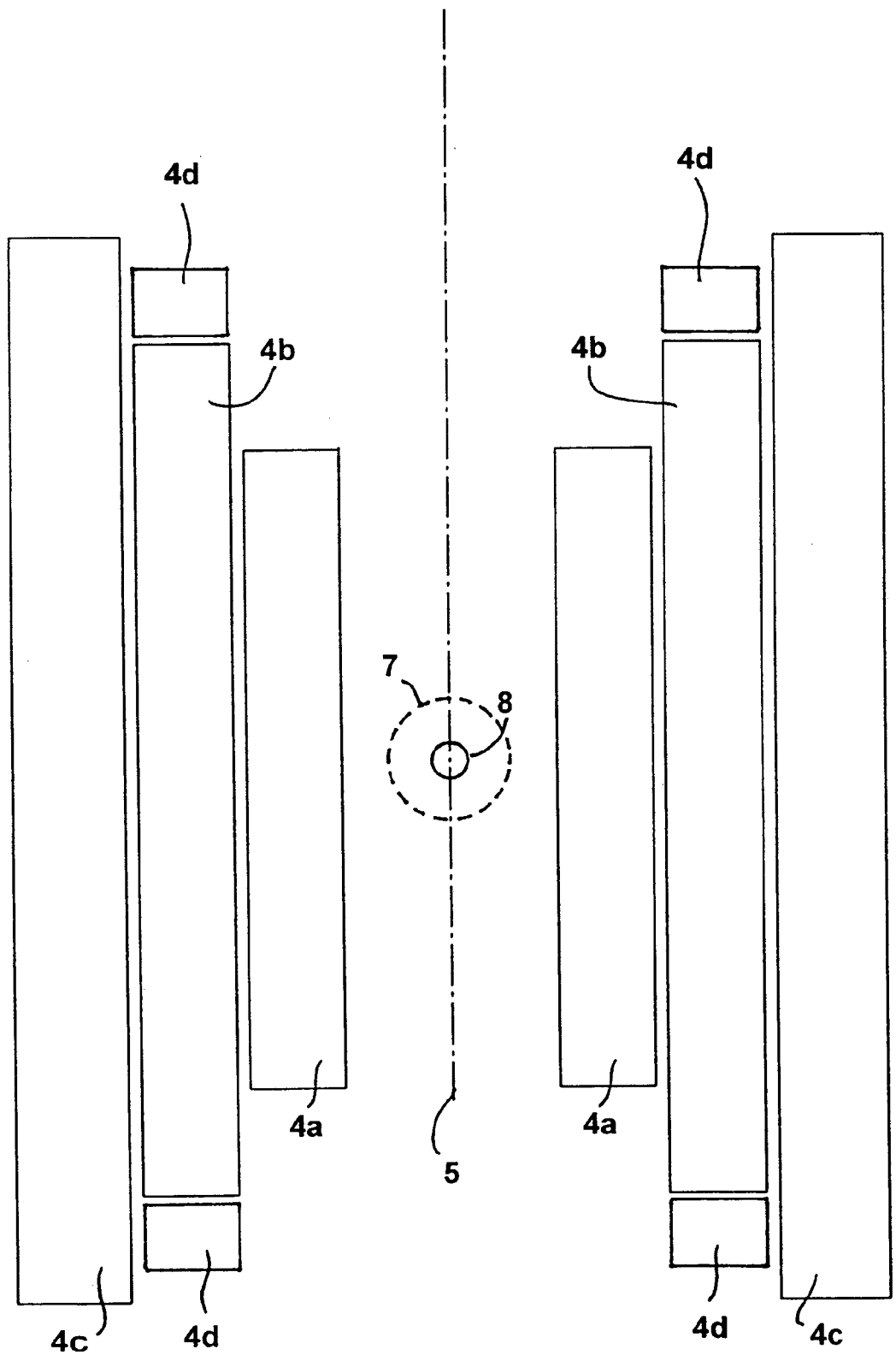
FIG. 2 shows an extremely schematic view of a magnet coil with HTS and LTS portion.

FIG. 2 is a highly schematic view of a magnet coil which consists of an HTS circuit 4a, 4d and an LTS circuit 4b, 4c which can each be separately superconductingly short-circuited, wherein all coil wires, leads, joints and switches in the HTS circuit contain HTS material and those of the LTS circuit contain LTS material. The radially inner HTS coil 4a is generally designed as simple solenoid. The HTS additional coils 4d which are short-circuited therewith in the HTS circuit, can now be dimensioned and positioned such that they either inductively decouple the two circuits—in this case they will have generally opposite windings—or the circuits are coupled such that e.g. the LTS circuit is charged through a residual drift in the HTS circuit such that the field at the sample location does not change. The overall coil arrangement is configured to generate a magnetic field in the volume under investigation 7 at the sample location 8, which is sufficiently homogeneous for NMR purposes, optionally in cooperation with ferromagnetic components (not shown), in particular, rings around the axis 5.

Figure 3:
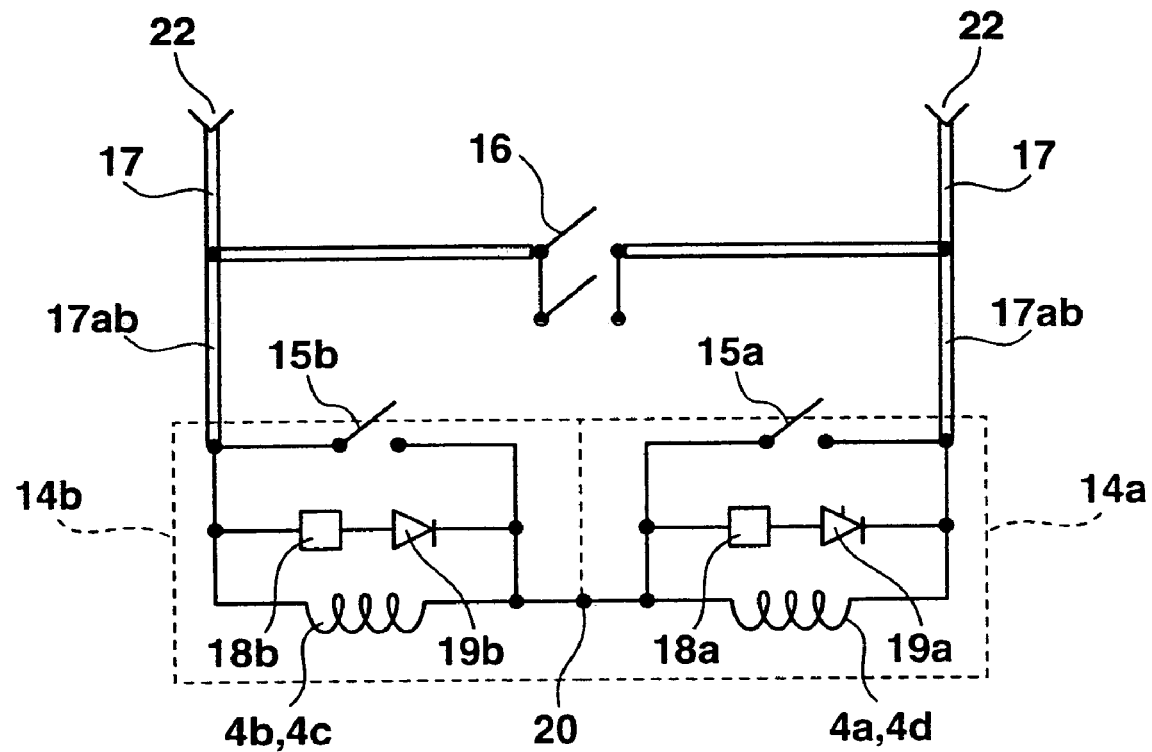
FIG. 3 shows an equivalent circuit diagram of an embodiment of the invention.

FIG. 3 shows an equivalent circuit diagram of an embodiment of the inventive magnet coil. A low-temperature superconducting LTS coil 4b, 4c which may consist of several serially connected partial coils, can be short-circuited via LTS leads and an LTS superconducting switch 15b in a pure LTS circuit 14b. The LTS coil 4b, 4c or sections thereof are resistively bridged through protective resistances 18b and/or protective diodes 19b. The LTS circuit 14b is connected via an LTS-HTS joint 20 to a pure HTS circuit 14a which correspondingly comprises an HTS coil 4a, 4d, HTS leads, an HTS switch 15a and protective resistances 18a and/or protective diodes 19a. Both circuits 14a, 14b can be connected to a common power supply (not shown) via leads 17. Optionally, both coils 4b, 4c; 4a, 4d may also be commonly short-circuited via a further LTS and/or HTS switch 16 in the low-temperature region. There may be further superconducting connections in the leads 17, in particular LTS-HTS joints. The leads 17 generally terminate in a plug connection 22 which can be joined to removable current leads to couple to the power supply outside of the cryostat 2. The leads 17 may consist partially or completely of parallel guided LTS and HTS conductors 17ab. This may also be the case for the leads of the LTS-HTS joint 20 including the switches 15a and 15b, which are doubled in this case. The "pure" HTS circuit means that there must be a superconductingly short-circuited circuit which comprises the HTS coil, HTS leads and HTS switches and with no HTS-LTS connection. The corresponding applies for a "pure" LTS circuit. The resistive protective switches 18a, 19a; 18b, 19b could thereby be connected to the respective coil via HTS-LTS or LTS-HTS joints or also resistively.

The two partial circuits 14a, 14b may be commonly or separately charged and discharged through connecting the external power supply to the plug connection 22 and opening the switches 15a and/or 15b. In particular, during operation with closed switches they need not carry the same current, i.e. during charging, only one of the two switches 15a or 15b can be initially closed while further charging the other circuit (which must be considered, of course, during discharging). The switch 16 is not required but may serve e.g. to equalize the currents in the two partial circuits when the current leads are removed by closing the switch 16 (or leaving it closed) and opening the switches 15a and 15b (temporarily). The equivalent circuit diagram may be further altered. It is important that the HTS circuit and the LTS circuit can be separately short-circuited and be charged.

Clearly, the invention is not limited to the embodiments shown and may be used in modifications. It can advantageously be combined with a plurality of conventional compensation measures for internal drifts and external disturbances. The coupling of the controlled, regulated or short-circuited coil circuits must thereby always be taken into consideration.

I claim:

1. A superconducting high-field magnet system for high-resolution magnetic resonance spectroscopy of a sample, the system comprising:
    a substantially cylindrical cryostat having an axial room temperature bore for receiving the sample;
    a radio frequency transmitting and detecting system in electromagnetic communication with the sample; and
    a magnet coil which is superconductingly short-circuited during operation and which is disposed at a low temperature in a region within the cryostat to surround the sample in the room temperature bore and to generate a homogeneous, temporally stable magnetic field at the sample location which is suitable for obtaining a high-resolution magnetic resonance spectrum, said magnet coil having a low-temperature superconducting (LTS) partial coil and a high-temperature superconducting (HTS) partial coil, wherein said LTS partial coil can be separately short-circuited in a pure LTS circuit via an LTS switch, and said HTS partial coil can be separately short-circuited in a pure HTS-circuit via an HTS switch, with both partial coils being connected via an LTS-HTS joint to be charged in series by a common power supply.

2. The magnet system of claim 1, wherein said HTS circuit and said LTS circuit are inductively decoupled.

3. The magnet system of claim 2, wherein said HTS circuit comprises coil regions that are locally separated from an actual HTS partial coil to effect inductive decoupling.

4. The magnet system of claim 1, wherein said HTS and said LTS partial coils are inductively coupled to substantially compensate for drifts in the magnetic field of said HTS and said LTS superconductingly short-circuited partial coils at the sample location.

5. The magnet system of claim 4, wherein said HTS circuit comprises coil regions which are locally separated from an actual HTS partial coil to adjust inductive coupling.

6. The magnet system of claim 1, wherein said magnet coil can be short-circuited via at least one of an LTS switch and an HTS switch.

7. The magnet system of claim 1, wherein at least one of said magnet coil, said LTS partial coil, and said HTS partial coil comprises leads or connections having parallel HTS and LTS conductors.

8. The magnet system of claim 1, wherein said magnet coil is actively shielded.

9. The magnet system of claim 8, wherein said LTS partial coil and said HTS partial coil are each designed as an actively shielded coil system.

10. The magnet system of claim 1, further comprising means for charging said HTS and said LTS circuits to different currents.

11. The magnet system of claim 1, wherein said magnet coil further comprises several serially connected sections which are protected through a network of resistances and/or diodes in response to uncontrolled transition into a normally-conducting state.

12. The magnet system of claim 1, wherein said HTS partial coil contains sections with at least one of NbTi multi-filament wire, A15 superconducting wire, Nb3Sn multi-filament wire, and MgB2 wire.

13. The magnet system of claim 1, wherein said HTS partial coil contains at least one of a conductor strip with silver matrix and HTS filaments, a conductor which is designed in accordance with a "coated-conductor" principle, and a conductor which is produced in accordance with a "powder-in-tube" method.

14. The magnet system of claim 1, wherein said HTS circuit comprises conductors, which contain one or more of the following materials: Bi2212, Bi2232, YBCO, and MgB2.

15. The magnet system of claim 1, wherein said magnet coil generates a magnetic field at the sample location of more than 15 Tesla or more than 20 Tesla.

16. The magnet system of claim 1, wherein said magnet coil is disposed in a helium tank.

17. A high-resolution magnetic resonance spectrometer comprising the magnet system of claim 1.

* * * * *